United States Patent [19]
Schmitt

[11] Patent Number: 5,975,735
[45] Date of Patent: Nov. 2, 1999

[54] METHOD AND APPARATUS FOR MOUNTING A PERIPHERAL DEVICE

[75] Inventor: Ty Schmitt, Round Rock, Tex.

[73] Assignee: Dell Usa, L.P., Round Rock, Tex.

[21] Appl. No.: 08/607,985

[22] Filed: Mar. 4, 1996

Related U.S. Application Data

[63] Continuation of application No. 08/485,196, Jun. 7, 1995, Pat. No. 5,586,003.

[51] Int. Cl.$^6$ ................................. G06F 1/16; H05K 7/10
[52] U.S. Cl. ......................... 364/131; 361/685; 361/683; 439/157
[58] Field of Search ............................... 364/131; 369/34, 369/36, 39, 75.1, 77.1; 360/98.01, 98, 97, 86; 361/683, 684, 685, 727; 439/66, 152–153, 157–160

[56] References Cited

U.S. PATENT DOCUMENTS

| | | | |
|---|---|---|---|
| 4,941,835 | 7/1990 | Lasmayoux et al. | 439/152 |
| 5,024,318 | 6/1991 | Schwarze et al. | 198/465.2 |
| 5,080,228 | 1/1992 | Maston, III et al. | 206/331 |
| 5,211,566 | 5/1993 | Bates et al. | 439/66 |
| 5,229,919 | 7/1993 | Chen | 361/391 |
| 5,233,594 | 8/1993 | Wilhelm | 360/98.01 |
| 5,325,263 | 6/1994 | Singer et al. | 361/683 |
| 5,586,003 | 12/1996 | Schmitt et al. | 361/683 |
| 5,587,889 | 12/1996 | Sacherman | 361/809 |
| 5,604,662 | 2/1997 | Anderson et al. | 361/685 |

*Primary Examiner*—Emanuel T. Voeltz
*Assistant Examiner*—Bryan Bui
*Attorney, Agent, or Firm*—Skjerven, Morrill, MacPherson, Franklin & Friel, LLP

[57] ABSTRACT

An apparatus and method for mounting a peripheral device within a computer system, wherein the apparatus includes one or more carrier units which may be selectively inserted between mounting rails within a peripheral unit storage device or rack designed to house, store and electrically connect peripheral electronic units within a larger electrical system. The carrier units include an electrical connector which is seated when the carrier is fully inserted into its stored position within the storage rack. The carrier includes a rotational door section which in turn engages a gearing arrangement on corresponding mounting rails to provide leverage to aid in the insertion of the electrical connector as the carrier door is rotated into a closed position. A guidance device on the door assures a proper alignment of the carrier before carrier insertion, and therefore proper engagement of the gearing arrangement. A latching device and alignment back stop tab provide additional positional and spatial alignment and stability for the carrier units.

30 Claims, 8 Drawing Sheets

METHOD AND APPARATUS FOR MOUNTING A PERIPHERAL DEVICE

CROSS REFERENCE TO RELATED APPLICATION(S)

This application is a continuation of Ser. No. 08485196, U.S. Pat. No. 5,586,003, filed Jun. 7, 1995, issued Dec. 17, 1996.

BACKGROUND

1. Field of the Invention

The present invention relates generally to computer systems and more particularly to a mounting arrangement for mounting peripheral units of a computer system.

2. Description of the Related Art

In the past, maintenance and upgrading of electrical equipment, especially equipment stored in rack mountable systems, has been extremely difficult because of the existing mounting mechanisms and because of the limited space available for the equipment. In many applications, including computer server systems, the components or subsystems and/or peripheral devices of the system are stored in a limited space area, in shelving units or racks, which serve a larger area of individual desktop stations. While the desktop units are relatively accessible from the rear to allow maintenance or upgrading, the same accessibility is often not available in the shelving units of the server system. The server systems are relatively heavy and cumbersome and their mounting and shelving arrangements are relatively stationary and bulky. When it is necessary to access the equipment components mounted in a shelving structure containing the server system, it has been necessary to perform considerable disassembly of the component enclosures to access the back end of the system components. Server external drive peripheral connections and cables are located at the rear of such external drives, i.e. for hard drives, tape, CD and floppy drives. This makes access to them, even after the cover is removed, difficult in most cases due to the presence of power supplies, boards, other external drives, and other various sheet metal and plastic parts. The user is, in some cases, faced with having to make blind connections, and in most cases, must navigate their hand through narrow sheet metal openings.

To alleviate some of the access problems of the past, in many component or peripheral mounting arrangements, peripheral units, such as hard drives for example, are mounted on removable sliding carriers. Such carriers are arranged to support a hard drive unit for example, which slides along rails that are mounted to a peripheral unit mounting cabinet or shelving structure. These component carriers are designed to be fully removable from the front of the cabinet. These component carriers are frequently held in place by a relatively large sheet metal front cabinet cover which must be removed in order to access and remove the sliding carriers containing the system hard drive units.

Recently, self-contained carrier units have been designed which include a front cover that aligns with the face of the cabinet such that the individual carrier may be slidably removed from the cabinet without removing the bulky cabinet front panel. However, such carriers, in many cases, are relatively loosely held in place and have therefore been vulnerable to damage from shock and vibration. Moreover, since most of these slidable carrier trays include an integral electrical connector or "hot plug", designed to automatically make an electrical connection with the rest of the system when the tray is fully inserted into the cabinet slot, the position of the slidable tray or carrier must be relatively stable and secure when in the closed position so that there is relatively little if any mechanical stress or strain imposed upon the electrical connector interface. That aspect is even more significant when the peripheral component is relatively heavy in comparison to the mass of the carrier supporting the peripheral component. In such an instance it is more likely that movement of the peripheral component on the carrier will loosen or even disengage the electrical connection between the carried component and the rest of the system.

Alignment of the carrier is also an important factor in the design of component carriers. In many instances, when component carriers are hastily placed into cabinets, the carrier is misaligned relative to the carrier space in the cabinet. The result of such misalignment is that the electrical connection at the rear of the carrier is either not made at all or only loosely connected and even more vulnerable to shock or vibration. These conditions may result in an unconnected peripheral device or a subsequent disconnection of the peripheral device and a related system malfunction.

Thus, there is a need for an improved peripheral component carrier system and apparatus for housing and supporting system peripheral components, which allows relatively easy and fast access to the peripheral component and also provides improved alignment and substantial support and positional stability for the peripheral component and carrier device.

SUMMARY

It is therefore an object of the present invention to provide an improved peripheral component carrier and housing method and system which is capable of housing peripheral components in relatively stable positions on the component carriers and also providing quick and easy access to such items when necessary.

It is therefore a feature of the present invention to provide a carrier structure for mounting a peripheral device within an electronic system. The carrier structure includes: a carrier, arranged to secure the peripheral device to be inserted into a stored location on an associated storage device, the associated storage device having guide rails; a carrier door coupled to the carrier, the carrier door being selectively rotatable around a door reference axis between an opened position and a closed position; and a coupling system, secured to the carrier door, for guiding the carrier between the opened and the closed positions. The coupling system includes: a guide pin, for engaging a slot on the guide rails; and a gear rack, coupled to the guide pin, for engaging gear slots on the guide rails; whereby the guide pin and the gear rack move conjointly to position the carrier within the associated carrier structure.

Another feature of the present invention is to provide the carrier structure as mentioned above where the peripheral device is a hard disk drive.

Yet another feature of the present invention is to provide the carrier structure as mentioned above where the carrier further includes an electro/mechanical connector, electrically connected to the peripheral device, and for connecting the peripheral device to the electronic system.

A further feature of the present invention is to provide the carrier structure as mentioned above where the connector is located on the opposite end of the peripheral device from the carrier door.

Another feature of the present invention is to provide the carrier structure as mentioned above where the associated storage device is a storing bay for mounting a plurality of the peripheral devices.

A further feature of the present invention is to provide the carrier structure as mentioned above where the carrier door further includes a finger grip, located on a front surface of the carrier door, the finger grip providing an engageable surface by which the carrier door may be held.

Yet another feature of the present invention is to provide the carrier structure as mentioned above where the finger grip allows a user to move the carrier door between the open and the closed positions.

Another feature of the present invention is to provide the carrier structure as mentioned above wherein the associated storage device includes a left rail and a right rail, the left rail and the right rail being mounted on left and right sides of the storage device. In addition, the left rail and the right rail have a track for mating with the guide pin, and gear slots, for mating with the gear rack.

A further feature of the present invention is to provide the carrier structure as mentioned above where the guide pin is operable to align the carrier structure relative to the associated storage device to guide an aligned movement of the carrier structure from the open position to the closed position.

Another feature of the present invention is to provide the carrier structure as mentioned above where the guide pin, when the carrier structure moves from the open position to the closed position, moves along the track in an arcuate fashion.

Yet another feature of the present invention is to provide the carrier structure as mentioned above where the track includes an enlarged frontal opening arranged to receive the guide pin and guide the guide pin to a position at which the gear rack and the gear slots are properly aligned for engagement.

Another feature of the present invention is to provide the carrier structure as mentioned above where the track extends along a curvilinear path thereby effecting a rotational movement of the carrier door between the open position and the closed position as the guide pin is moved along the track.

A further feature of the present invention is to provide the carrier structure as mentioned above further including a latching device, coupled to the carrier door, the latching device being selectively operable in conjunction with the carrier door to latch the carrier door section in the closed position, the latching device being further selectively operable to selectively unlatch the carrier door to allow the carrier door to be moved out of the closed position.

An additional feature of the present invention is to provide the carrier structure as mentioned above where the latching device includes a clip arranged on the carrier door, the latching device further including a clip retainer on the associated storage device, the clip being selectively operable to engage and disengage with the clip retainer on the associated storage device.

In another aspect, it is a feature of the present invention to provide a storage system for mounting a plurality of peripheral devices within a computing system, the storage system including: a plurality of storage bays, each bay for storing one of the peripheral devices; a plurality of guide rail sets, each set attached to each of the storage bays, the guide rail sets mounted on a left side and a right side of each of the storage bays, the guide rail sets for securing one of the peripheral devices within each of the storage bays; a plurality of peripheral carriers, for securing one of the peripheral devices within each of the peripheral carriers, and for mounting the peripheral carriers to the guide rail sets. In one embodiment each of the peripheral carriers include: a carrier, arranged to mechanically secure one of the peripheral devices; a carrier door, coupled to the carrier, the carrier door for moving between a first position, and a second position; and a coupling system, secured to the carrier door, for mating with one of the guide rail sets and thereby guiding the carrier into one of the storage bays; whereby as the carrier is moved into one of the storage bays, the coupling system mates with one of the guide rail sets, and the carrier door moves from the first position to the second position.

Another feature of the present invention is to provide the storage system as mentioned above where at least one of the guide rail sets further includes: a track, positioned on a front side of at least one of the rails in the guide rail set; and a first gear rack, also positioned on the front side of the at least one of the rails in the guide rail set; whereby the track and the first gear rack provide a mechanism for guiding one of the peripheral carriers into one of the storage bays.

Yet another feature of the present invention is to provide the storage system as mentioned above where the coupling system further includes: a guide pin, for engaging the track on the guide rail set; and a second gear rack, coupled to the guide pin, for engaging with the first gear rack on the guide rail set.

Another feature of the present invention is to provide the storage system as mentioned above where the guide pin and the gear rack move conjointly to position the peripheral carrier within one of the storage bays.

Another feature of the present invention is to provide the storage system as mentioned above where when the guide pin mates with the track, and the second gear track mates with the first gear track, the carrier door moves from the first position to the second position.

In another aspect, it is a feature of the present invention to provide a method for installing a peripheral carrier into a compartment of an associated housing structure, the compartment including rail supports on opposite sides thereof, the method including the steps of: aligning the peripheral carrier with the rail supports; rotating a door of the peripheral carrier from an open position to a closed position; and engaging a coupling apparatus to couple the carrier device to the associated housing structure substantially concurrently with the rotating, whereby the peripheral carrier is moved between an open location and a stored location as the door is rotated between from the open position to the closed position.

Another feature of the present invention is to provide the method as mentioned above, the method further including: latching the peripheral carrier to the rail supports when the door is in the closed position.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION

Although the present invention will be explained in connection with a preferred embodiment as applicable to a computer system, it will be understood that the principles of the present invention are equally applicable to any shelving system where it is desirable to mount peripheral units or components of the system on carrier units. It should be appreciated that the present invention is also applicable where quick and easy access to peripheral units is desired, especially where the peripheral units include a "hot plug" arrangement such that the system peripheral units are both mechanically mounted in a carrier and electrically connected to the system from or through the carrier device.

In the Figures, like numerals refer to like parts although not all of the like parts are numbered in all of the drawings.

Figure 1:
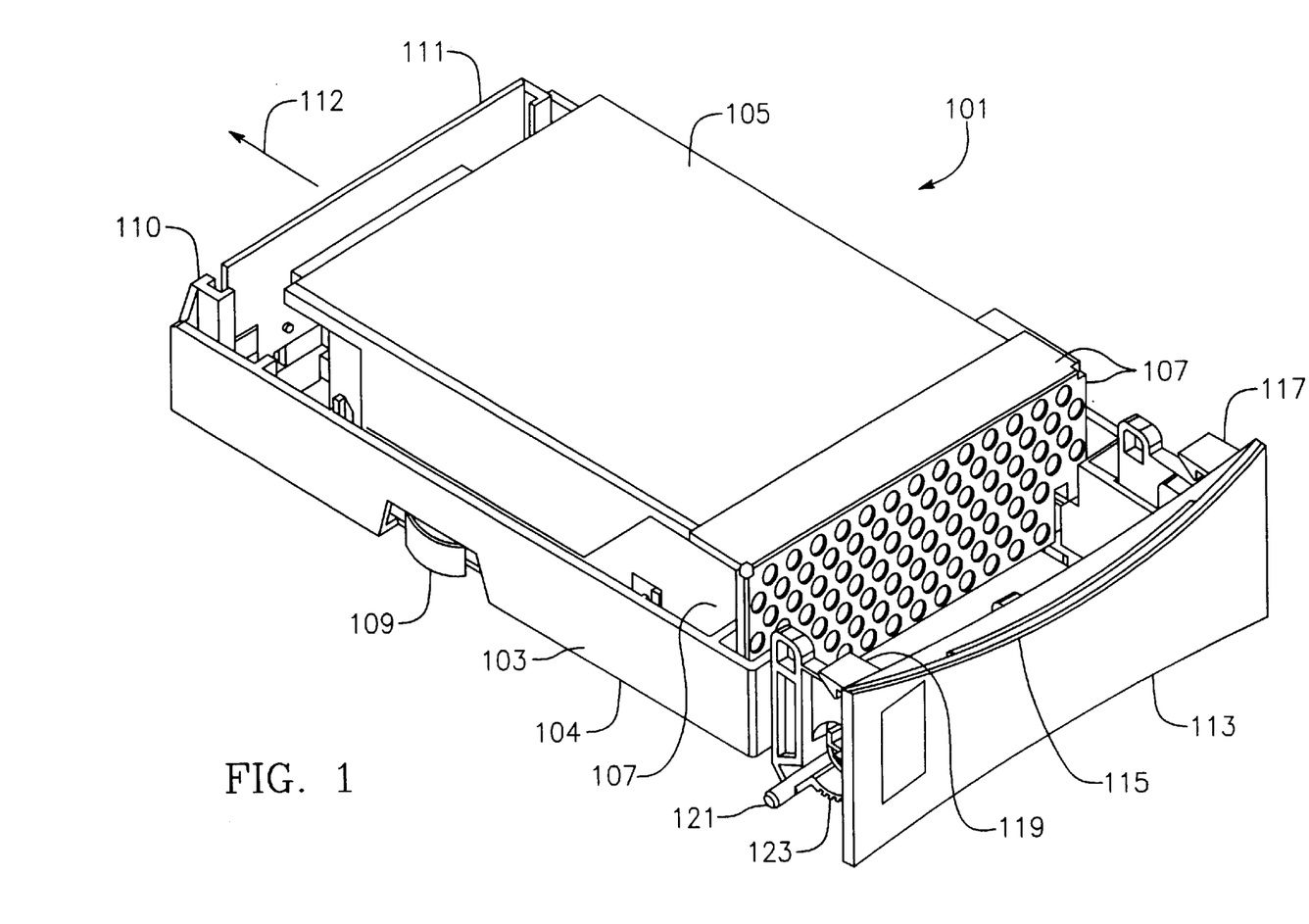
FIG. 1 is a top left perspective illustration showing a peripheral carrier device of an exemplary embodiment of the present invention, including an exemplary hard drive unit mounted therein.

Referring now to FIG. 1, there is shown a carrier structure and hard drive unit 101. A carrier device or carrier tray 103 includes a bed or support section 104 at the bottom of the carrier 103 which is arranged to support and have mounted thereon an item to be stored, such as a peripheral unit 105. The peripheral unit 105 may be, for example, a hard drive unit. A metal "EMI" shield 107 is shown on the carrier 103 and coupled to the hard drive 105 to reduce electromagnetic radiation from the drive 105. The shield 107 includes a grounding terminal 109 which is arranged to contact a grounding connection on a storage rack (not shown) into which the carrier 103 is placed. In one embodiment, the shield 107 includes spring fingers (not shown) for contacting the peripheral unit 105, thereby making a ground contact. The carrier 103 also includes a mounting structure 110 for mounting a circuit board 111. The mounting structure 110 secures the circuit board 111, but allows the circuit board 111 to "float" in x, y and z directions to allow blind mating of a connector 201, discussed with reference to FIG. 2, to an associated connector in a peripheral cabinet. The hard drive 105 is electrically connected to the circuit board 111 which, in turn, is connected to the connector 201 at the rear of the circuit board 112. The connector 201 is designed to be connected to a receptacle and to the remainder of the electrical system when the carrier is moved in a first direction i.e. a carrier insertion or mounting direction 112, and fully inserted into a stored position on an equipment storage rack structure.

Figure 2:
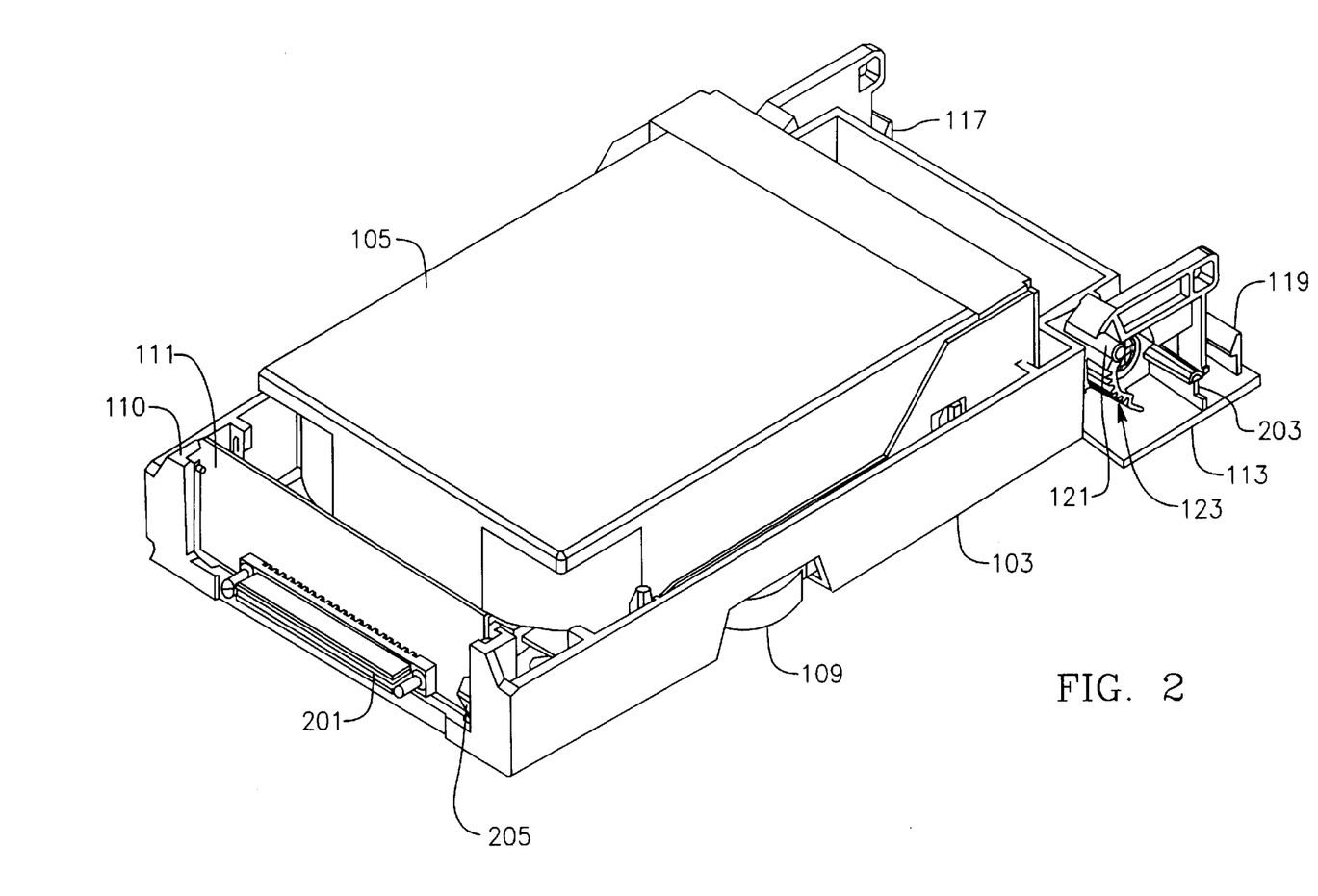
FIG. 2 shows the carrier and hard drive of FIG. 1 from a top rear perspective.

The carrier 103 also includes a rotatable frontal section or door section 113. The frontal or door section 113 includes, in the present example, a finger grip 115 to facilitate positioning of the carrier 103. The carrier front door 113 further includes first and second latching devices or clips 117 and 119. The clips 117 and 119 are designed to latch or clip on to corresponding lugs (not shown) which are part of the mounting or slide rails shown in more detail in connection with FIGS. 5–8. A guide pin 121, which serves as a carrier alignment guide device, is also mounted on the door section 113, and is arranged to extend slightly beyond the sides of the carrier 103. In the present example, there is one guide pin on each side of the door section 113 although a single guide pin is sufficient to accomplish the carrier alignment function served thereby. The guide pin 121 is designed to engage with corresponding guide slots on mounting rails which are shown in more detail in connection with FIG. 5. Also shown as part of the door section 113 of the carrier 103 is a coupling device such as a pinion gear arrangement 123. The pinion gear 123 is arranged to conditionally engage with a matching gear rack (FIG. 5) to provide precise alignment and mounting stability for the carrier 103. The guide pin 121 acts to align the carrier 103 so that the pinion gear 123 meshes correctly with a matching rack gear 500 to properly move the carrier 103 between an open location and a stored location within an associated mounting rack (not shown). As shown in FIG. 1, the carrier door 113 is in the "up" or "closed" position. The door 113 however, may be rotated around a carrier door reference axis 303 (FIG. 3), which, in the present example, is also the central axis for the circular pinion gear 123, to a fully open, unlocked and electrically disconnected position as shown in FIG. 2. The carrier door reference axis 303 may be hereinafter referred to as simply the "door reference axis" or the "door axis".

Now referring to FIG. 2, the carrier 103 and hard drive 105 are shown from a top rear left perspective. Also shown is the carrier door 113 in an open position. As illustrated, the circuit board 111 includes an electrical connector 201 for electrically connecting and disconnecting the hard drive 105 with the rest of the system. Also shown in FIG. 2 is a closed position guide tab 203 which is effective to provide a second guide mechanism, in addition to the guide pin 121, to insure the correct alignment of the carrier device 103. As can be seen from FIG. 2, with the door 113 in the open position, the latches or clips 117 and 119, which are designed to latch on to corresponding rail sections (not shown) are unlatched, and the pinion gear 123 in an "up" or disengaged position.

Also shown in FIG. 2 is the connector 201 attached to the circuit board 111. The circuit board 111 is held into position by the mounting structure 110. In addition, a spring clip 205 is provided as part of the mounting structure 110. The spring clip 205 provides spring force in the z direction to allow the circuit board 111 to translate towards the peripheral device 105 as the connector 201 is mated with an associated connector (not shown).

Figure 3:
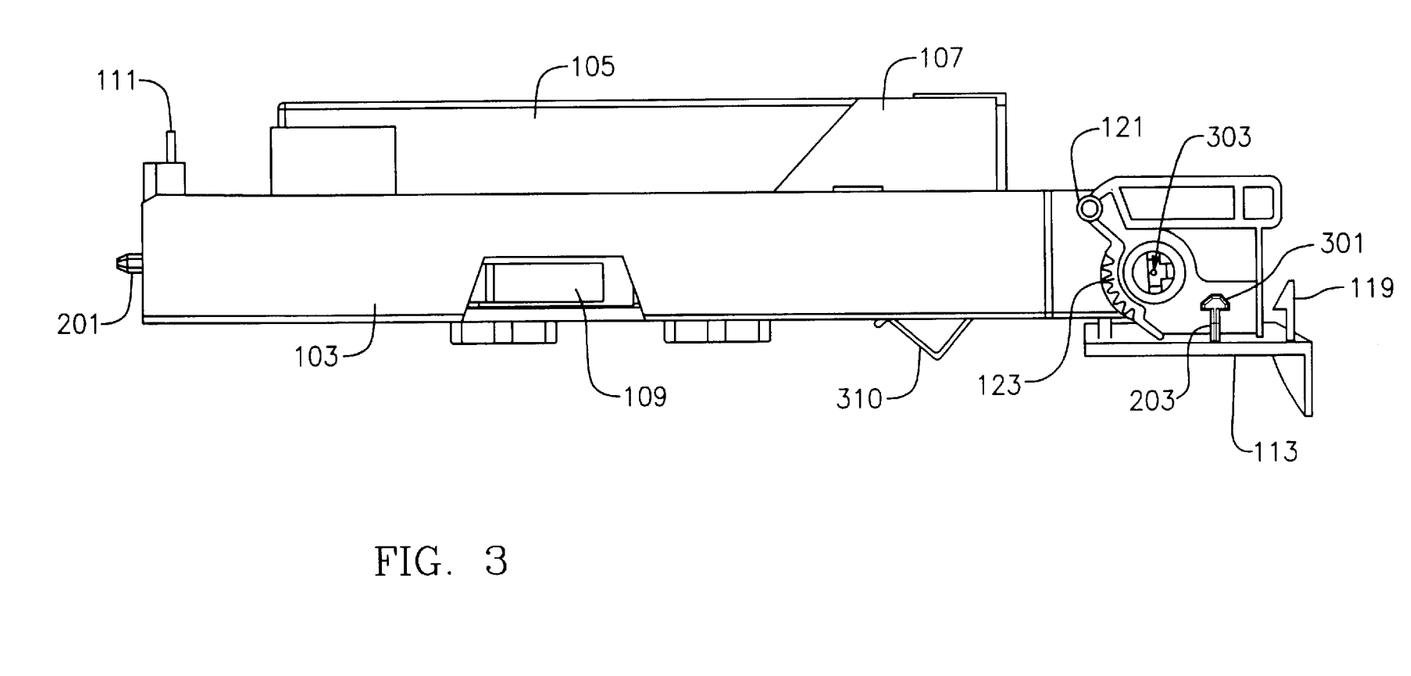
FIG. 3 shows a left side view of the carrier and drive peripheral unit.

Now referring to FIG. 3, a side view of the carrier 103 and the peripheral hard drive unit 105, with the carrier door 113 in the open position, is shown. As illustrated, the closed position guide element or tab 203 includes a head section 301. The guide pin 121, the pinion gear 123, the guide tab 203, and the latches 117 and 119 are all mounted on and move together with the carrier door 113 which is selectively rotatable around the reference axis 303. The guide pin 121 may be considered as a first or open position guide element for the carrier door 103 while the guide element or tab 203, may be considered as a second or closed position guide element for the carrier door 103.

Also shown in FIG. 3 are a plurality of ground clips 310. These ground clips 310 are designed to provide ground contacts between the bottom of one ground shield 107, and the top surface of a ground shield 107 on a corresponding carrier.

Figure 4:
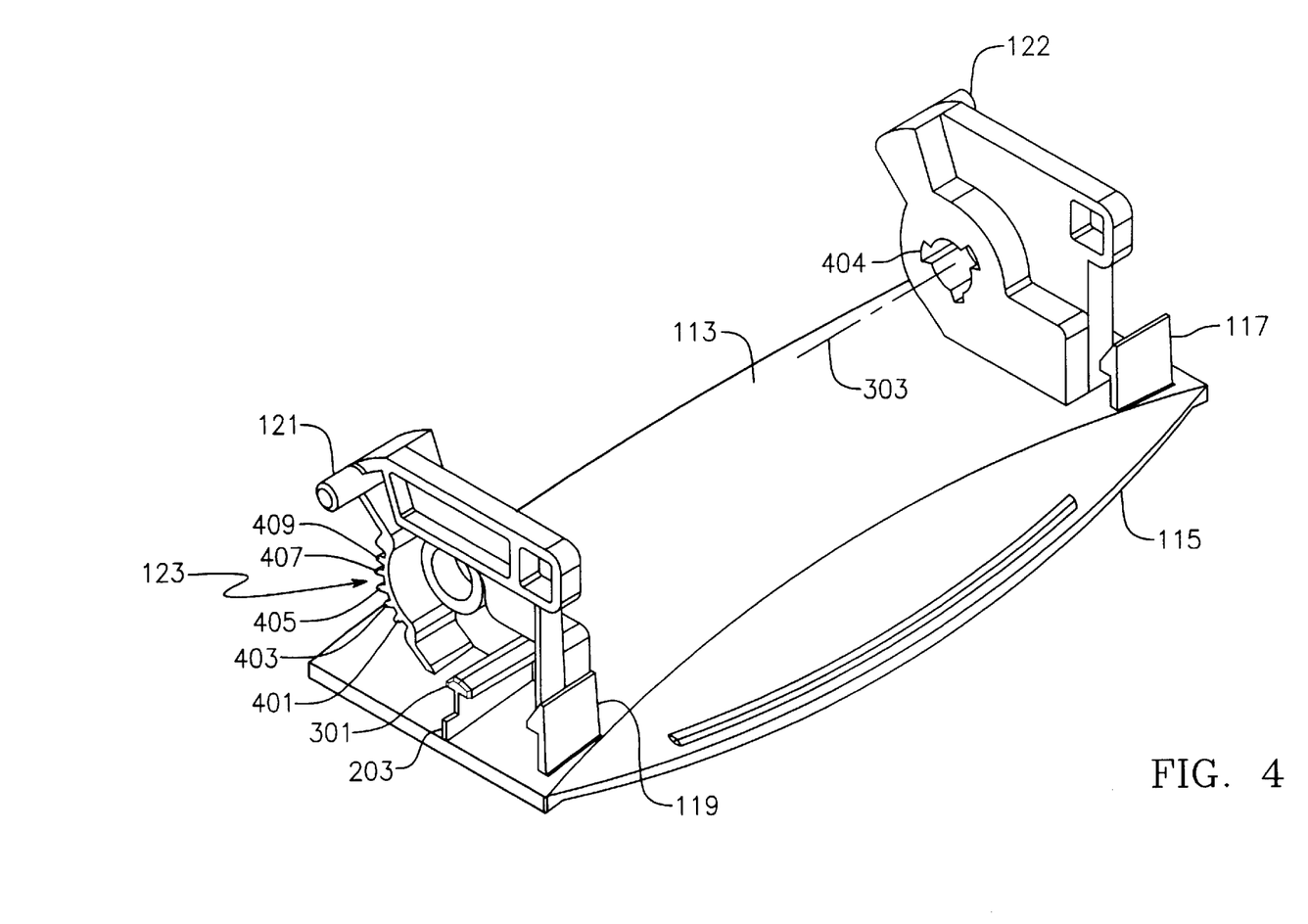
FIG. 4 is a top left perspective view of the door assembly of the carrier unit shown in FIGS. 1–3.

FIG. 4 is a top left perspective view of the door assembly 113 of the carrier unit 103 shown in FIGS. 1–3. The door assembly 113 is detachably mounted through mounting retaining recesses 404 to corresponding lugs (not shown) on the main body or flat bed portion of carrier 103, which supports the hard drive 105 in the present example. The pinion gear 123 is shaped to have its center axis coincident with the reference axis 303 through the recess 404. The door 113 includes guide pins 121 and 122 on each side of the carrier door 113. In the present example, the carrier door 113 is generally symmetrically configured with similar functional structural elements corresponding to the guide pin 121, pinion gear 123, guide tab 203, and clip 119, on each side of the carrier door section 113. In the FIG. 4 exemplary embodiment, there are five pinion gear teeth 401, 403, 405, 407 and 409, which together comprise the pinion gear 123. Gear tooth 401 is designated the bottom gear tooth and gear tooth 409 is designated the top gear tooth. There could of course be more or less gear teeth depending upon the system requirements. It should be noted that as shown in FIG. 4, the door 113 is in the open position and the guide pins 121 and 122 are in their uppermost positions as are the corresponding pinion gear assemblies.

Figure 5:
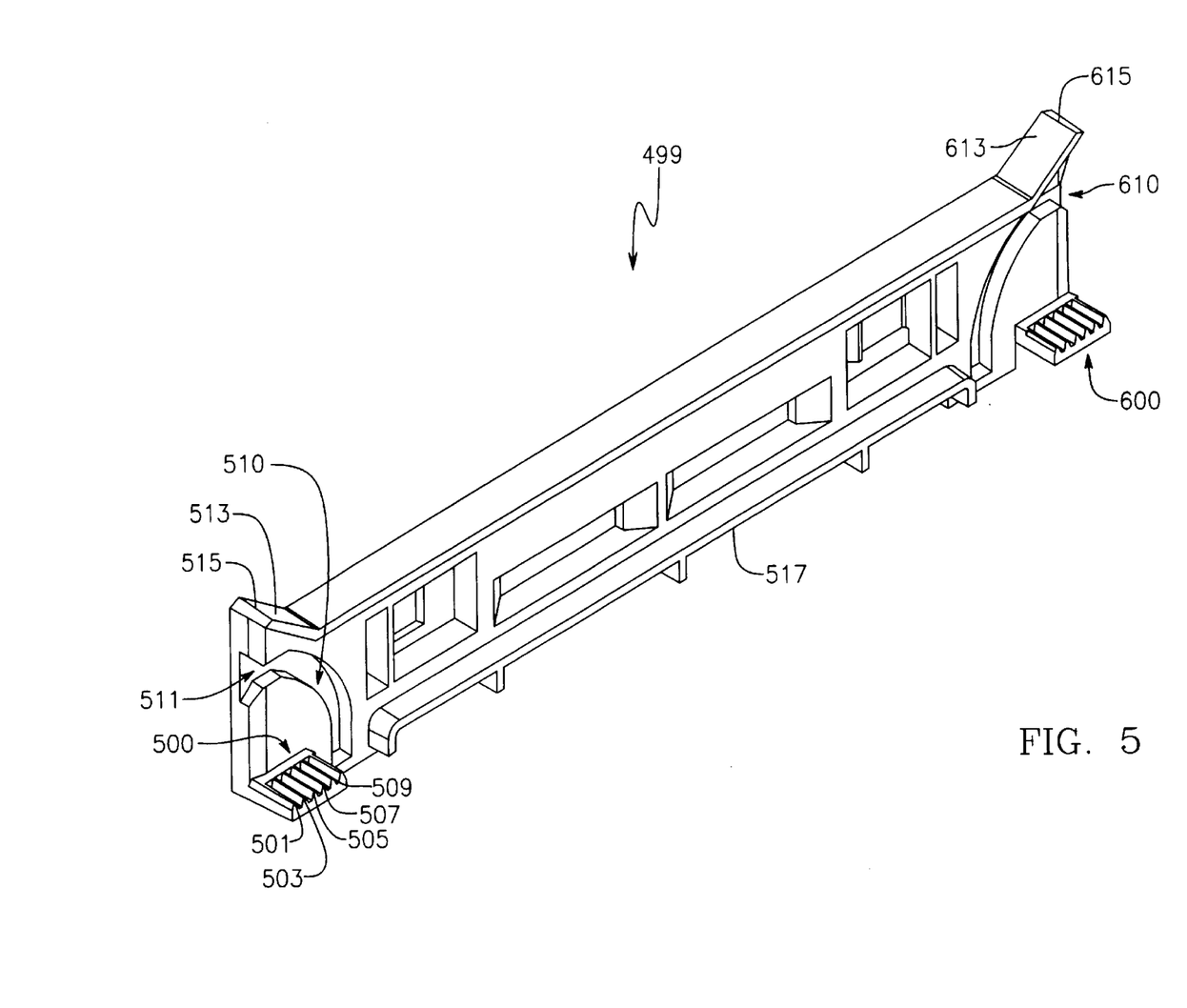
FIG. 5 illustrates the details of one of the rail sections implemented to position the exemplary carrier device.

Now referring to FIG. 5, the details of one of a pair of mounting rail sections or rails 499 are shown. The mounting rails 499 are implemented to position the exemplary carrier device 103. In the present example, the mounting rail 499 shown in FIG. 5 is symmetrical in construction at both ends of the rail such that the same rail 499 may be rotated and used on either side of a carrier 103 thereby requiring one less, manufactured part for the carrier system disclosed herein. The disclosed exemplary carrier system is designed to have a rail 499 mounted on both the left and right sides of a cabinet or rack structure for each peripheral component. The rack structure (not shown) can be a simple shelving arrangement or structure defining compartments therein for housing peripheral unit carrier devices such as the carrier 103. The mounting rails 499 are secured on both the left and right sides of such compartments such that the carrier devices 103 may be selectively and slidably mounted thereon. As noted above, the exemplary carrier system is arranged such that when a carrier 103 is fully inserted into a compartment and between a set of mounting rails 499, the carrier 103 is forced into or "hot plugged" into a corresponding electrical receptacle which is mounted on the mounting rack structure (not shown).

In FIG. 5, a gear rack 500 is shown integrally mounted on the rail section 499. The gear rack 500 includes five gear slots and is designed to selectively mesh with the corresponding pinion gear 123 of the carrier 103. In a carrier closed position, the five gear teeth 401, 403, 405, 407 and 409 of the pinion gear 123 will mesh with corresponding gear slots 501, 503, 505, 507 and 509, respectively, of the gear rack 500. A guide pin slot 510 is arranged on the rail 499 to receive and guide a corresponding guide pin 121 from an entry position at entry slot 511 arcuately to the lower section of the guide pin slot 510 as the carrier 103 is pushed into its position between a pair of rails such as rail 499. It should be noted that unless the guide pin 121 is aligned with the entry slot 511, the carrier 103, to which the guide pin 121 is connected, is prevented from moving into a position between mounting rails 499.

Mounting rail 499 also includes a latching surface 513 and a latching edge 515. The latching surface 513 is positioned to receive the cover or door clip 119 for example, and as the door 113 is closed, and the guide pin 121 enters the guide pin slot 510, the clip 119 bends upwardly to ride over and latch upon the latching edge 515 when the carrier door 113 is fully closed. It should also be noted that as the guide pin 121 traverses the guide pin slot 510, the pinion gear 123 is correspondingly engaging the gear rack 500 such that when the guide pin 121 is at the bottom of the pin slot 510, the pinion gear 123 is fully engaged with the gear rack 500 with pinion tooth 401 engaging gear slot 501 and pinion gear 409 engaging with gear slot 509. The rail 499 also includes a sliding rail 517 which is arranged to allow the outside corners of the carrier 103 to move along corresponding slide rails of left and right rail sections mounted within a peripheral unit compartment of a mounting rack structure. As noted above, the construction at the opposite end of the rail 499, is substantially symmetrical to the front end and includes a gear rack 600, a pin guide slot 610 a latching surface 613 and a latching edge 615. When a carrier 103 is mounted at the front end of the rail 499, the symmetrical construction at the rear of the rail 499 is not operational, but is shown to illustrate how the illustrated left-hand rail section 499 may be rotated 180 degrees in a horizontal plane to function as the right-hand rail section, thereby reducing the number of parts required to implement the disclosed carrier system.

Figure 6:
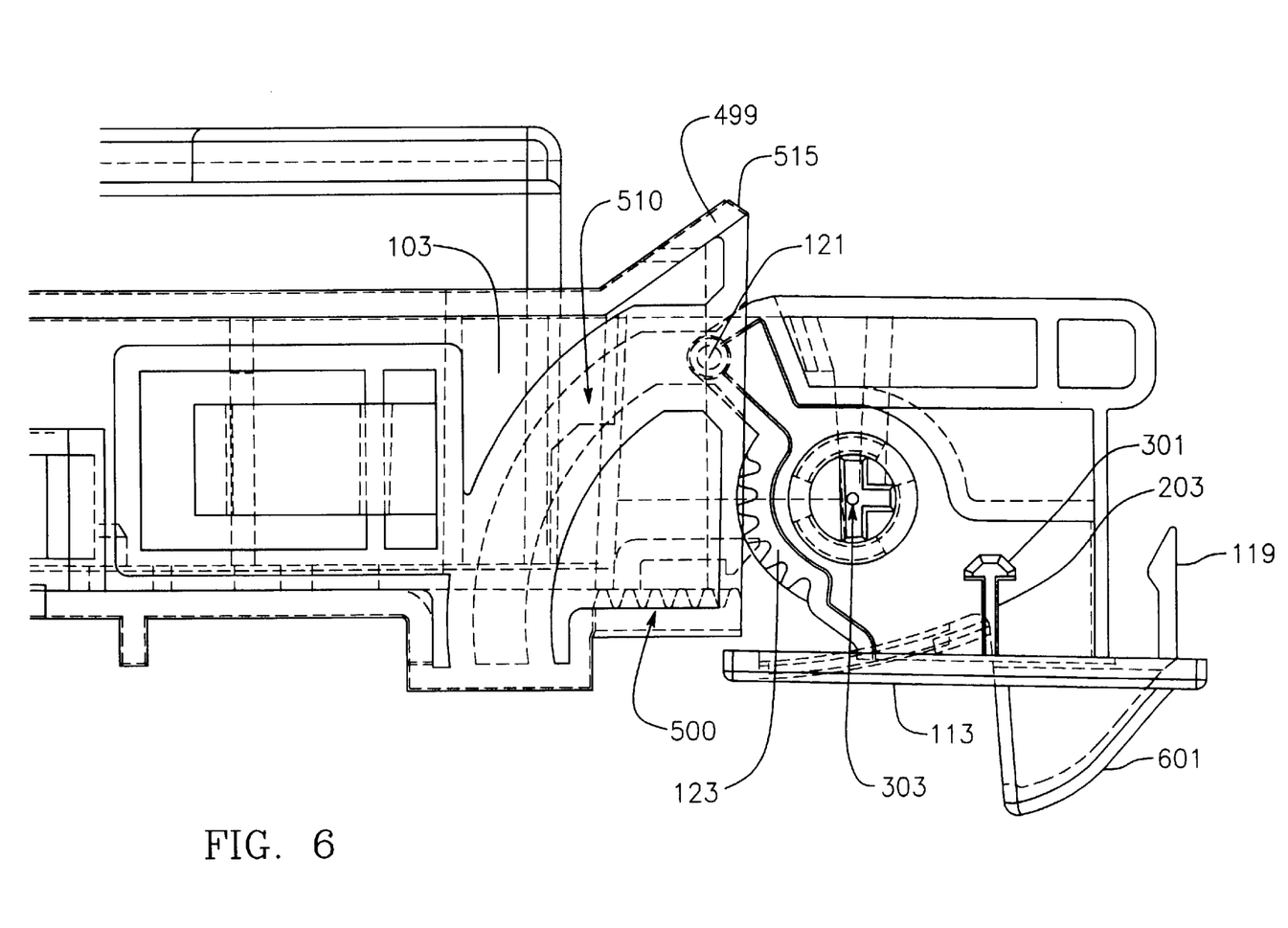
FIG. 6 is a left side schematic illustration showing the relationship between various elements of the carrier frontal or door section, and the slide rail as the carrier is being initially aligned for insertion between a set of slide rails mounted on a rack structure.
Figure 7:
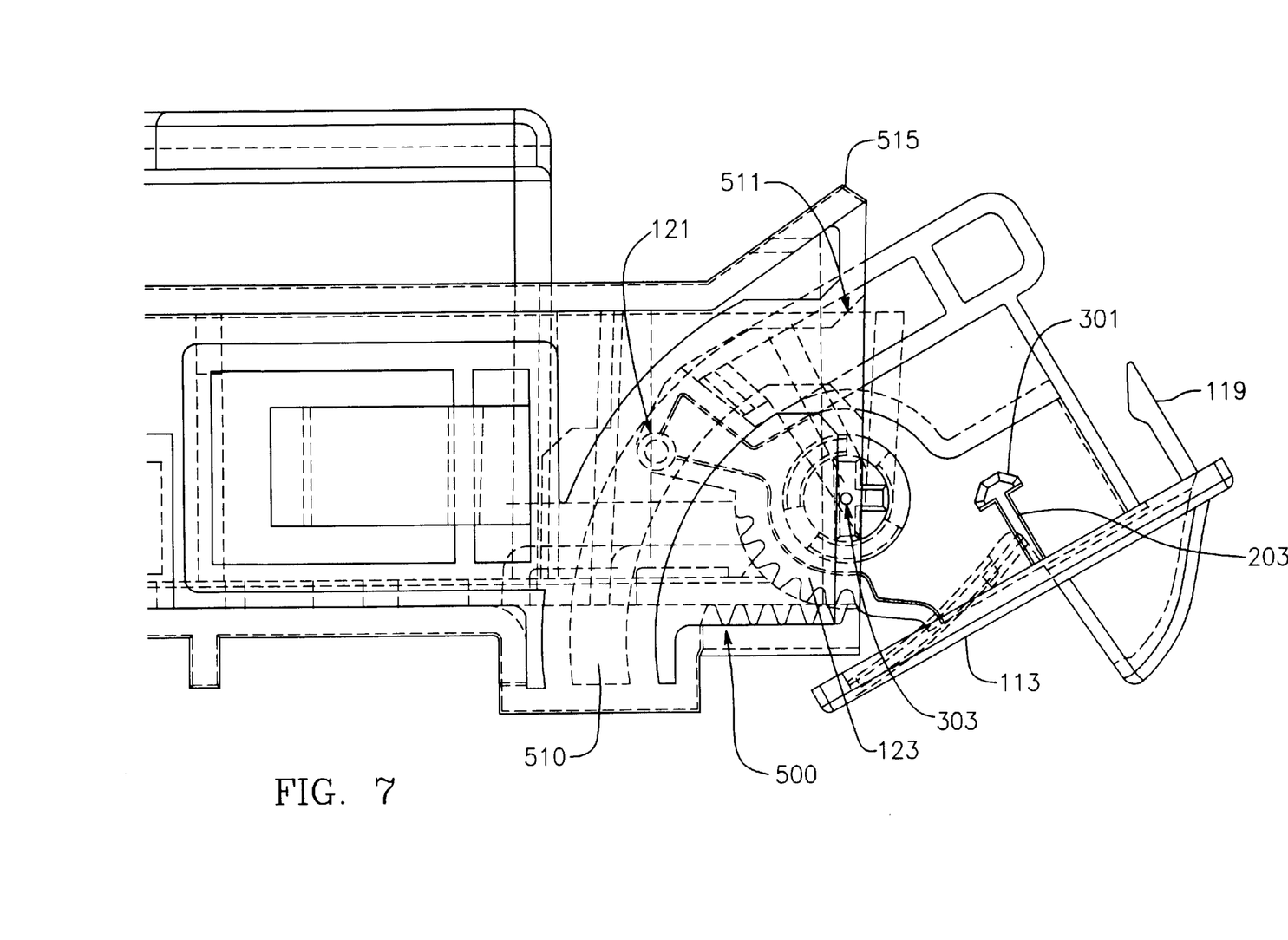
FIG. 7 is a schematic illustration showing the relationships of FIG. 6 when the carrier door is partially inserted between the slide rails.
Figure 8:
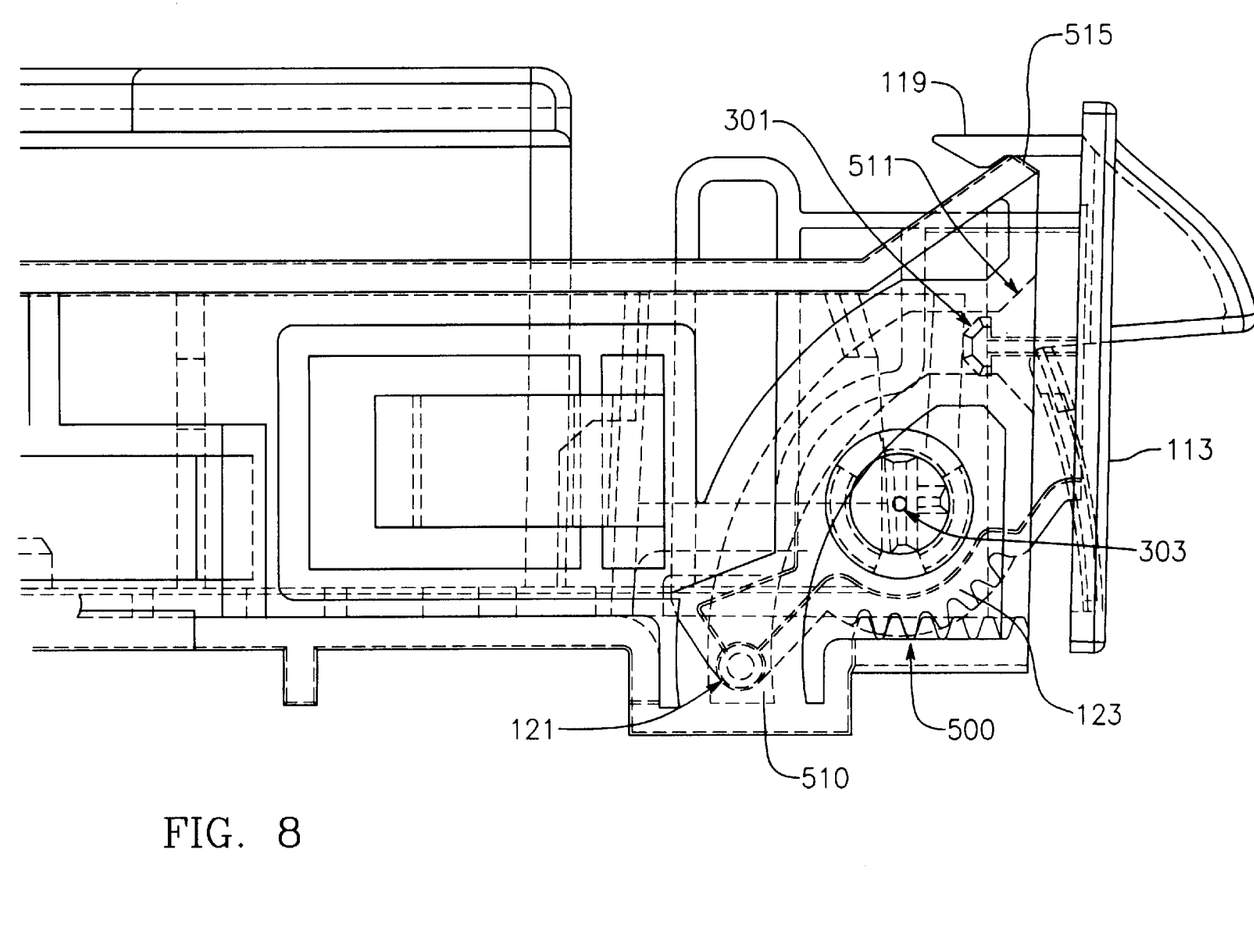
FIG. 8 is a schematic illustration showing the relationship between various mounting system elements when the carrier is fully inserted between the slide rails and the carrier door is fully closed and latched.

In operation, reference is made to FIGS. 6–8. FIG. 6 is a schematic side view illustration showing the relationship between various elements of the carrier door 113 and the slide rail 499 as the carrier 103 is being initially aligned for insertion between a set of rails 499 mounted on a rack or shelving structure. The carrier door 113, including the pinion gear 123, guide pin 121, clip 119, guide tab 203 and head 301, and a finger grip 601 are shown in an open position relative to corresponding parts on a mounting rail 499, including guide pin slot 510, gear rack 500 and latching edge 515. As the carrier 103 is moved towards the rear of the shelving structure, the guide pin 121 is guided into the guide pin slot 510, at which point the carrier door 113 is positioned and properly aligned with the mounting rail 499 and the pinion gear 123 begins to engage with the gear rack 500. This engagement of the pinion 123 and the rack 500 can only occur when the carrier 103 is at the correct alignment relative to the rail sections thereby insuring a proper seating of the carrier 103 between appropriate rail sections and a secure and solid electrical connection between the carrier electrical connector 201 and the electrical system.

FIG. 7 is a schematic illustration showing the relationships between and among the various parts shown in FIG. 6 when the carrier door 113 is partially closed. The pinion gears 123 begin to engage with the gear rack 500 as the door 113 rotates about a reference axis 303. The action of the pinion gears 123 and the rack 500 forces the carrier 103 to enter a peripheral compartment including the rail 499 as the carrier door 113 is lifted in an upward direction relative to the flat bed or main section of the carrier 103. As the carrier door 113 continues to be lifted upwardly, the guide pin 123 will continue toward the lower portion of the guide slot entry 511. In addition, the head 301 of the guide tab 203 moves toward the entry portion 511 of the guide pin slot 510, and the tab or clip 119 continues to move toward the latching edge 515 on the rail section 499.

FIG. 8 is a schematic illustration showing the relationship between various mounting system elements when the carrier 103 is fully inserted between the slide rails and the carrier door 113 is fully closed and latched. When the carrier door 113 is fully closed, the clip 119 latches over the latching edge 515 to provide additional positional or spatial stability for the door 113 as well as the carrier 103 itself. Positional or spatial stability for the carrier 103 which carries a relatively heavy hard drive 105 for example, is also provided through the action of the pinion gear 123 and gear rack 500 as well as the position of the guide pin 121 within the guide pin slot 510. With a relatively simple upward motion, which can be accomplished with one hand, the carrier 103 including a mounted hard drive 105, can be securely mounted between mounting rails in a peripheral cabinet, and the necessary electrical connection from the carried hard drive to the electrical system can also be made automatically and positively with the same simple motion.

The apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention as defined by the following claims.

I claim:

1. A carrier structure for mounting a peripheral device within an electronic system, the carrier structure comprising:
   a carrier, arranged to secure the peripheral device to be inserted into a stored location on an associated storage device, said associated storage device having guide rails;
   a carrier door coupled to said carrier, said carrier door being selectively rotatable around a door reference axis between an opened position and a closed position; and
   a coupling system, secured to said carrier door, for guiding said carrier between said opened and said closed positions, said coupling system comprising:
      a guide pin, for engaging a slot on said guide rails; and
      a gear rack, coupled to said guide pin, for engaging gear slots on said guide rails;
   whereby said guide pin and said gear rack move conjointly to position said carrier within said associated carrier structure.

2. The carrier structure as recited in claim 1 wherein said peripheral device is a hard disk drive.

3. The carrier structure as recited in claim 1 wherein said carrier further comprises an electro/mechanical connector, electrically connected to said peripheral device, and for connecting said peripheral device to the electronic system.

4. The carrier structure as recited in claim 3 wherein said connector is located on the opposite end of said peripheral device from said carrier door.

5. The carrier structure as recited in claim 1 wherein the associated storage device is a storing bay for mounting a plurality of said peripheral devices.

6. The carrier structure as recited in claim 1 wherein said carrier door further comprises a finger grip, located on a front surface of said carrier door, said finger grip providing an engageable surface by which said carrier door may be held.

7. The carrier structure as recited in claim 6 wherein said finger grip allows a user to move said carrier door between said open and said closed positions.

8. The carrier structure as recited in claim 1 wherein the associated storage device comprises a left rail and a right rail, said left rail and said right rail being mounted on left and right sides of the storage device.

9. The carrier structure as recited in claim 8 wherein at least one of said left rail and said right rail have a track for mating with said guide pin, and gear slots, for mating with said gear rack.

10. The carrier structure as recited in claim 1 wherein said gear rack is a pinion gear and said gear slots mate to corresponding teeth in said gear rack.

11. The carrier structure as recited in claim 1 wherein said guide pin is operable to align said carrier structure relative to said associated storage device to guide an aligned movement of said carrier structure from said open position to said closed position.

12. The carrier structure as recited in claim 1 wherein said guide pin, when said carrier structure moves from said open position to said closed position, moves along the track in an arcuate fashion.

13. The carrier apparatus as set forth in claim 10 wherein said alignment guide device comprises a guide pin mounted on said carrier door section and a corresponding guide pin slot arranged on the associated storage device to receive said guide pin.

14. The carrier structure as set forth in claim 1 wherein said track includes an enlarged frontal opening arranged to receive said guide pin and guide said guide pin to a position at which said gear rack and the gear slots are properly aligned for engagement.

15. The carrier structure as set forth in claim 1 wherein said track extends along a curvilinear path thereby effecting a rotational movement of said carrier door between said open position and said closed position as said guide pin is moved along said track.

16. The carrier structure as recited in claim 1 further comprising a latching device, coupled to said carrier door, said latching device being selectively operable in conjunction with said carrier door to latch said carrier door section in said closed position, said latching device being further selectively operable to selectively unlatch said carrier door to allow said carrier door to be moved out of said closed position.

17. The carrier structure as recited in claim 16 wherein said latching device comprises a clip arranged on said carrier door, said latching device further comprising a clip retainer on the associated storage device, said clip being selectively operable to engage and disengage with said clip retainer on the associated storage device.

18. A storage system for mounting a plurality of peripheral devices within a computing system, the storage system comprising:
   a plurality of storage bays, each bay for storing one of said peripheral devices;
   a plurality of guide rail sets, each set attached to each of said storage bays, said guide rail sets mounted on a left side and a right side of each of said storage bays, said guide rail sets for securing one of said peripheral devices within each of said storage bays;
   a plurality of peripheral carriers, for securing one of said peripheral devices within each of said peripheral carriers, and for mounting said peripheral carriers to said guide rail sets, each of said peripheral carriers comprising:
      a carrier, arranged to mechanically secure one of said peripheral devices;
      a carrier door, coupled to said carrier, said carrier door for moving between a first position, and a second position; and
      a coupling system, secured to said carrier door, for mating with one of said guide rail sets and thereby guiding said carrier into one of said storage bays;
      whereby as said carrier is moved into one of said storage bays, said coupling system mates with one of said guide rail sets, and said carrier door moves from said first position to said second position.

19. The storage system as recited in claim 18 wherein at least one of said peripheral devices is a hard disk drive.

20. The storage system as recited in claim 18 wherein at least one of said guide rail sets further comprise:
   a track, positioned on a front side of at least one of the rails in said guide rail set; and
   a first gear rack, also positioned on said front side of said at least one of the rails in said guide rail set;
   whereby said track and said first gear rack provide a mechanism for guiding one of said peripheral carriers into one of said storage bays.

21. The storage system as recited in claim 20 wherein said coupling system further comprises:
   a guide pin, for engaging said track on said guide rail set; and
   a second gear rack, coupled to said guide pin, for engaging with said first gear rack on said guide rail set.

22. The storage system as recited in claim 21 wherein said guide pin and said gear rack move conjointly to position said peripheral carrier within one of said storage bays.

23. The storage system as recited in claim 22 wherein when said guide pin mates with said track, and said second gear track mates with said first gear track, said carrier door moves from said first position to said second position.

24. The storage system as recited in claim 23 wherein said carrier door moves in an arcuate fashion from said first position to said second position.

25. The storage system as recited in claim 23 wherein each of said peripheral carriers further comprise a connector, mechanically secured to said carrier, and electrically connected to said one of said peripheral devices.

26. The storage system as recited in claim 25 wherein said connector provides an electrical connection between said one of said peripheral devices and said storage system.

27. The storage system as recited in claim 26 wherein when said carrier door moves from said first position to said second position, said connector is mated to an associated connector within said one of said plurality of storage bays.

28. A method for installing a peripheral carrier into a compartment of an associated housing structure, said compartment including rail supports on opposite sides thereof, said method comprising the steps of:
   aligning said peripheral carrier with said rail supports;
   rotating a door of said peripheral carrier from an open position to a closed position; and
   engaging a coupling apparatus to couple said carrier device to said associated housing structure substantially concurrently with said rotating, whereby said peripheral carrier is moved between an open location and a stored location as said door is rotated between from said open position to said closed position.

29. The method as recited in claim 28, the method further comprising:
   latching said peripheral carrier to said rail supports when said door is in said closed position.

30. The method as recited in claim 28 wherein the peripheral carrier has an electrical connector mounted thereon, said method further comprising:
   making an electrical connection between the electrical connector and a corresponding electrical receptacle on the housing structure when said carrier device is in said closed location.

* * * * *